(12) United States Patent
Barber et al.

(10) Patent No.: US 6,635,519 B2
(45) Date of Patent: Oct. 21, 2003

(54) STRUCTURALLY SUPPORTED THIN FILM RESONATOR AND METHOD OF FABRICATION

(75) Inventors: Bradley Paul Barber, Chatham, NJ (US); Peter Ledel Gammel, Millburn, NJ (US); Yiu-Huen Wong, Summit, NJ (US)

(73) Assignee: Agere Systems, Inc., Allentown, PA (US)

( * ) Notice: Subject to any disclaimer, the term of this patent is extended or adjusted under 35 U.S.C. 154(b) by 0 days.

(21) Appl. No.: 10/043,969

(22) Filed: Jan. 10, 2002

(65) Prior Publication Data

US 2003/0129785 A1 Jul. 10, 2003

(51) Int. Cl.⁷ ............................................... H01L 21/00
(52) U.S. Cl. ........................ 438/151; 438/48; 438/50; 438/53; 257/414
(58) Field of Search ........................... 438/151, 48, 50, 438/53; 257/414

(56) References Cited

U.S. PATENT DOCUMENTS

| 5,260,596 | A | * | 11/1993 | Dunn et al. | 257/414 |
| 5,307,311 | A | * | 4/1994 | Sliwa, Jr. | 365/174 |
| 5,367,308 | A | | 11/1994 | Weber | 343/700 |
| 5,587,620 | A | | 12/1996 | Ruby et al. | 310/346 |
| 5,698,471 | A | * | 12/1997 | Namba et al. | 437/225 |
| 5,698,928 | A | | 12/1997 | Mang et al. | 310/322 |
| 5,867,302 | A | | 2/1999 | Fleming | 359/291 |
| 5,873,153 | A | | 2/1999 | Ruby et al. | 29/25.35 |
| 5,930,640 | A | | 7/1999 | Kenney | 438/396 |
| 6,355,498 | B1 | * | 3/2002 | Chan et al. | 438/48 |
| 6,377,136 | B1 | * | 4/2002 | Rittenhouse et al. | 333/188 |

OTHER PUBLICATIONS

Related U.S. application, Ser. No. 09/637,069, filed Aug. 11, 2000 pat# 6355498.

* cited by examiner

Primary Examiner—Vu A. Le
Assistant Examiner—Pho Luu
(74) Attorney, Agent, or Firm—Harness, Dickey & Pierce, P.L.C.

(57) ABSTRACT

In the thin film resonator, a piezoelectric membrane is disposed over a substrate. A first support structure defines a space over the substrate and supports the edges of the piezoelectric membrane such that the piezoelectric membrane is disposed over this space. A further support structure is disposed within the space to the piezoelectric membrane.

28 Claims, 6 Drawing Sheets

STRUCTURALLY SUPPORTED THIN FILM RESONATOR AND METHOD OF FABRICATION

BACKGROUND OF THE INVENTION

1. Field of the Invention

The present invention relates to thin film resonators.

2. Description of Related Art

Membrane type piezoelectric resonators are useful for making RF filters and other circuit elements in electronic equipment such as wireless terminals and handsets. Typically, a very thin piezoelectric member, sandwiched between electrodes, is suspended over a cavity. And, while the membranes are very thin, about 2.5 microns for an aluminum nitride membrane in a 2 GHz application, the membranes must span a cavity several hundred microns wide.

Such membranes are prone to bowing, either because of inherent stresses therein or external stress (e.g., an applied voltage, temperature change, handling, etc.). If the membrane bows toward a nearby solid structure, proximity or contact can lessen or destroy any advantages to the structure being initially fabricated as a membrane.

SUMMARY OF THE INVENTION

In the thin film resonator according to the present invention, a support structure is provided within the cavity spanned by the piezoelectric membrane. The support structure serves to attenuate or prevent the bowing of the piezoelectric membrane and thus eliminate the problems and disadvantages discussed above with respect to thin film resonators. Alternatively, or additionally, the support structure serves to desirably change the acoustical properties of the piezoelectric membrane. Specifically, according to the embodiments of the present invention, the support structures are formed in the sacrificial layer that is removed to form the cavity. By photolithography and deposition of an etch resistant material, structures such as columns, struts, pegs, etc. are formed in the sacrificial layer. Because the structural elements have a different etch selectivity from that of the sacrificial material, when the sacrificial material is etched away to create the cavity, the support structure elements remain.

Accordingly, these support structures improve the yield and reliability of the manufactured devices by decreasing the occurrence of membrane cracking and breaking. Furthermore, the support structures improve the response of the piezoelectric membrane by preventing unwanted motion that affects the desired electrical signature, and alternatively or additionally, the support structures desirably change the electrical signature.

In another embodiment, the support structures provide for stacking membranes and the formation of a protective cap layer, without the fear of having the membrane negatively affected by possible contact with the cap layer.

BRIEF DESCRIPTION OF THE DRAWINGS

The present invention will become more fully understood from the detailed description given herein below and the accompanying drawings which are given by way of illustration only, wherein like reference numerals designate corresponding parts in the various drawings, and wherein.

DETAILED DESCRIPTION OF THE PREFERRED EMBODIMENTS

The method of forming a thin film resonator with supports according to a first embodiment of the present invention will be described with respect to FIGS. 1–5. FIGS. 1–4 are cross-sectional views showing the process steps in fabricating the thin film resonator according to the first embodiment of the present invention.

Figure 1:
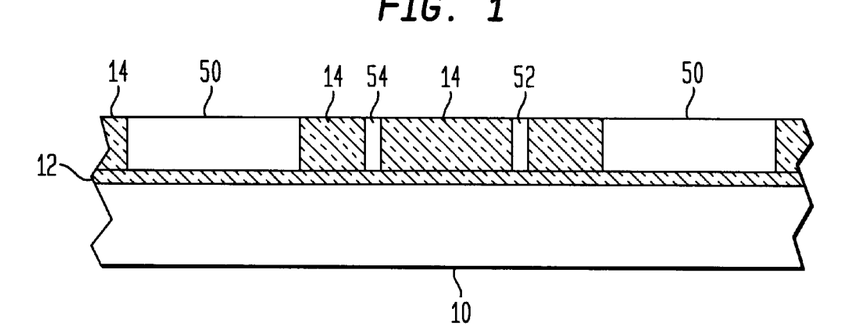
FIGS. 1–4 illustrate the method of fabricating a thin film resonator according to a first embodiment of the present invention.

As shown in FIG. 1 a lower etch stop layer 12 is formed on a silicon substrate 10. Preferably, the lower etch stop layer is formed by growing or depositing $SiO_2$ or $Si_3N_4$ over the silicon substrate 10. A sacrificial layer 14 is deposited over the etch stop layer 12. Preferably the sacrificial layer 14 is a high resistivity silicon layer deposited by sputtering. However, the thickness of the piezoelectric layer 19 may differ depending on the desired frequency response of the resonator. Continuing to refer to FIG. 3, a second conductive is layer deposited over the substrate, and patterned to form upper electrodes 20.

Figure 4:
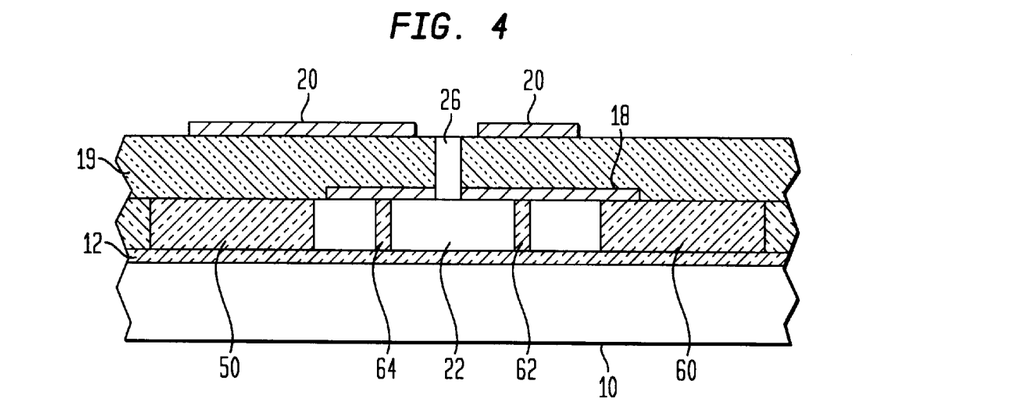

Then, as shown in FIG. 4, one or more vias 26 are formed through the second conductive layer 20 (if present at locations where vias are desired), the piezoelectric layer 19 and the lower electrode 18 (if present at locations where vias are desired) to expose the sacrificial layer 14 disposed between the lateral etch barriers 60. The sacrificial layer 14 disposed between the lateral etch barriers 60 is then etched away to form a cavity 22. The etchant used is $X_eF_2$ gas, which attacks the silicon forming the sacrificial layer 14 but does not attack the aluminum forming the lower electrode 18, the lateral etch barriers 60, or the lower etch stop layer 12. Accordingly, the lateral etch barriers 60 define the width of the cavity 22, while the height of the lateral etch barriers 60 along with the lower etch stop layer 12 define the depth of the cavity. Furthermore, the etchant does not etch away the strut 62 or the column 64. Consequently, the strut 62 and column 64 remain within the cavity and serve as a support structure for the piezoelectric layer 19 spanning the cavity 22.

Figure 5:
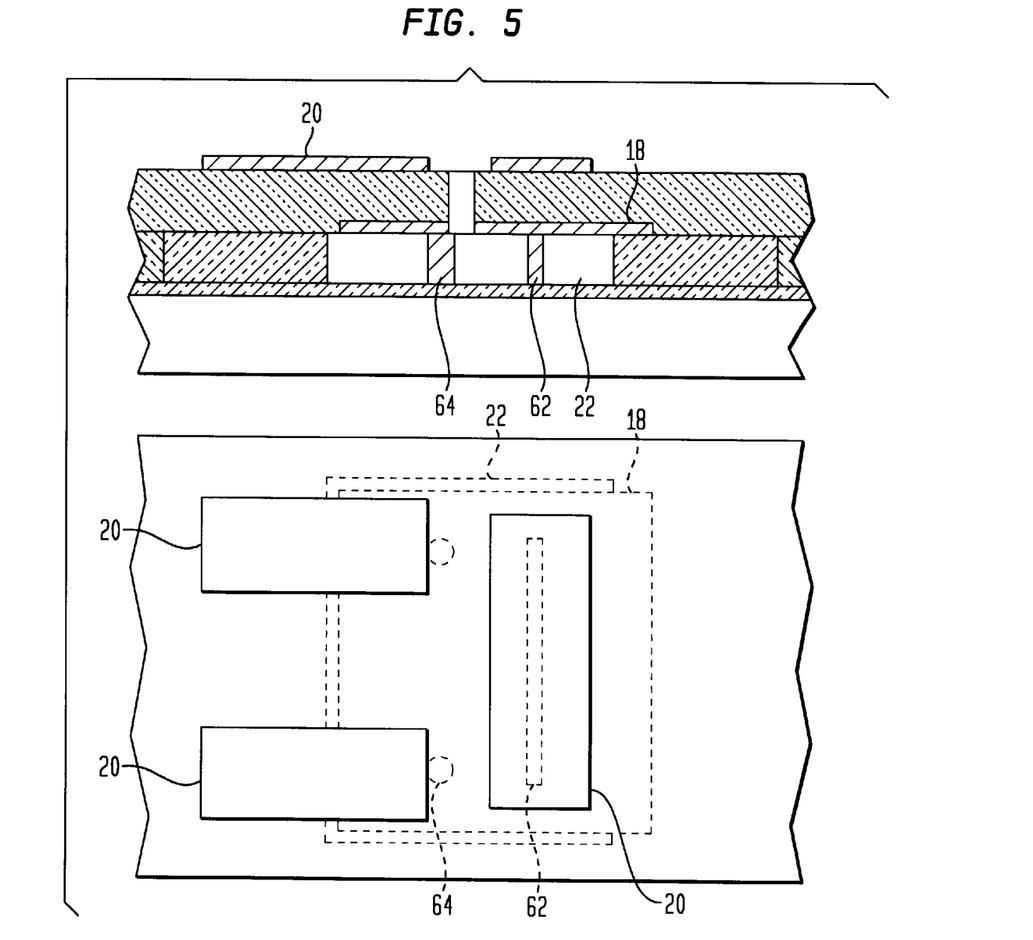
FIG. 5 illustrates a planar view and correlation between planar and cross-sectional views of the thin film resonator according to the first embodiment of the present invention.

FIG. 5 illustrates a planar view of the resulting thin film resonator illustrated in FIG. 4 and further illustrates which elements in the planar view correspond to elements in the cross-sectional view. From FIG. 5 it will be further appreciated that the strut 62 and the column 64 are disposed within the active resonator space of the cavity; namely, under both the upper electrodes 20 and the lower electrode 18.

As discussed previously, a large freestanding membrane is very susceptible to out of plane warping and breaking from small amounts of stress. Spacing supports at intervals As further shown in FIG. 1, a photolithography process is conducted to pattern the sacrificial layer 14. The patterning creates a pair of wide lateral trenches 50, a narrow trench 52, and at least one hole 54. The wide lateral trenches 50 serve to define lateral etch stop barriers in later processing steps, while the narrow trench 52 and the hole 54 define the shape of piezoelectric membrane support structures produced in later processing steps. As one skilled in the art will readily appreciate, depending upon the desired shape of the support structures, the sacrificial layer 14 disposed between the lateral trenches 50 will be patterned accordingly.

Figure 2:
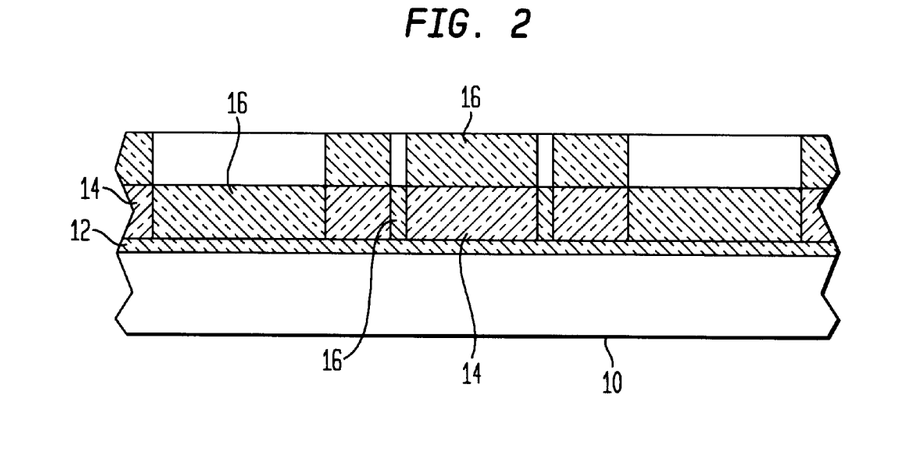

Next, as shown in FIG. 2, a release resistant material 16 is deposited over the substrate 10. The release resistant material 16 fills the lateral trenches 50, the narrow trench 52 and the hole 54. In this embodiment, the sacrificial layer 14 is formed of silicon; the release resistant material 16 and the lower etch stop layer 12 are formed of $SiO_2$ or $Si_3N_4$; and as described below, $X_eF_2$ is used as the etchant ($X_eF_2$ etches silicon but not $SiO_2$ or $Si_3N_4$). However, it should be understood that these layers are not limited to the materials set forth above. Instead, the release resistant material 16 and the lower etch stop layer 12 should be chosen to have a different etch selectivity from that of the sacrificial layer 14.

In a subsequent processing step, the structure shown in FIG. 2 is planarized until the sacrificial layer 14 is exposed. As a result, lateral etch barriers 60 are formed in lateral trenches 50, a strut 62 is formed in narrow trench 52, and a column 64 is formed in hole 54.

Figure 3:
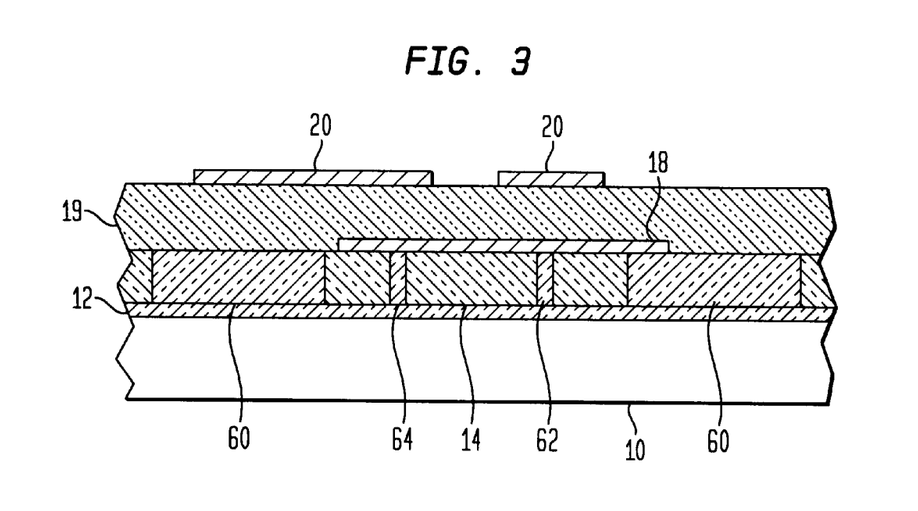

As shown in FIG. 3, a conductive layer, such as aluminum, is deposited over the substrate, and patterned to form a lower electrode 18. Next, a piezoelectric layer 19 is formed over the substrate 10. Preferably the piezoelectric layer 19 is formed of a piezoelectric material such as AlN to a thickness of 1–5 microns, preferably 2.7 microns. along and across the membrane allows larger stresses before displacement results. Under compressive or tensile stress, the stress focusing at membrane boundaries can cause breakage. Adding support structures can reduce or distribute the peak stresses and reduce membrane breakage. Also handling of the device during packaging or other post-fabrication steps can break fragile membranes. These supports reduce damage by reducing the membranes fragility. As a result of these improvements in membrane robustness, improvements in yield and reliability associated with the devices' manufacture are realized.

Furthermore, it will be appreciated that nearly any motion of a piezeoelectric material, by its nature, produces an electric signature. Piezoelectric membrane flexing can introduce electrical behavior superposed on the response from the piezoelectric membrane compression. Consequently, electrical signals, which detrimentally interfere with a desired response, can be created. Reduced coupling to and reinforcement of unwanted types of motion through the use of the support structure as shown in the present invention can reduce or eliminate interference with the desired response. Also, placement of these structures can introduce desired electrical features into the response.

As will be appreciated from this disclosure, the placement and shape of the support structure elements are not limited to the placement and shapes (columns and struts) shown in FIGS. 1–5. Instead, it will be appreciated that the shape and placement of support structures will be established based on desired design parameters. Furthermore, in an alternative embodiment, lateral etch barriers 60 are not formed. In this embodiment, the etch vias 26 are properly spaced and the timing of the undercutting etch is controlled to release the piezoelectric membrane 18 by a desired amount. The remaining, unetched, sacrificial material will then act to define the space and act as the support structure for the perimeter of the membrane.

Figure 6:
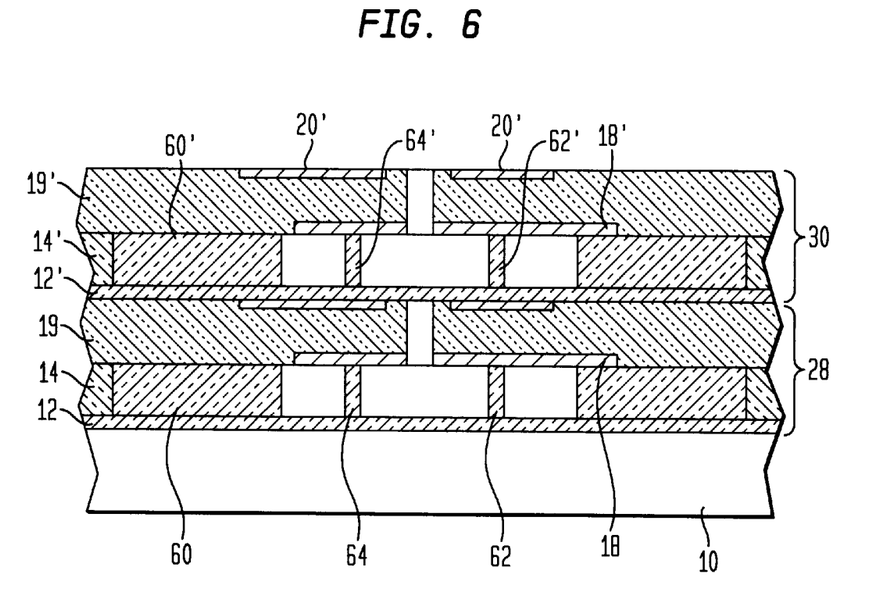
FIG. 6 illustrates a second embodiment of the thin film resonator according to the present invention.

FIG. 6 illustrates a second embodiment of the present invention. As shown, the process illustrated in FIGS. 1–4 is conducted to create a first piezoelectric membrane structure 28, which includes the piezoelectric membrane 19 and the underlying support structure. Then, the same process of FIGS. 1–4 is repeated to create a second piezoelectric membrane structure 30. Because the process steps are the same as described with respect to FIGS. 1–4, and the resulting structure of the second piezoelectric membrane structure 30 is the same as the first piezoelectric membrane structure 28, the same reference numerals, albeit with primes, have been used to designate like components. Furthermore, because the process for creating the second piezoelectric membrane structure 30 is the same as described above with respect to FIGS. 1–4, a detailed description of these process steps will not be repeated for the sake of brevity. For a more robust and planar manufacture, the step of sacrificial material removal is done once at the end, removing the sacrificial material beneath piezoelectric membrane 19 and 19'.

As illustrated in FIG. 6, the support structure for the second piezoelectric membrane, in particular the strut 62' and column 64', is in alignment with the support structure of the first piezoelectric membrane structure 28 (e.g., strut 62 and column 64). However, the invention is not limited to this alignment. Instead, electrode lay and piezoelectric membrane shape can require non-alignment. Furthermore, the placement of the supports on different level are also used to achieve a desired amount of acoustical coupling between the piezoelectric membranes so as to produce a desirable electrical signature that is different than could be achieved by simply electrically connecting the layers.

As will be further appreciated, further additional piezoelectric membrane structures can be formed on the structure illustrated in FIG. 6.

Figure 7:
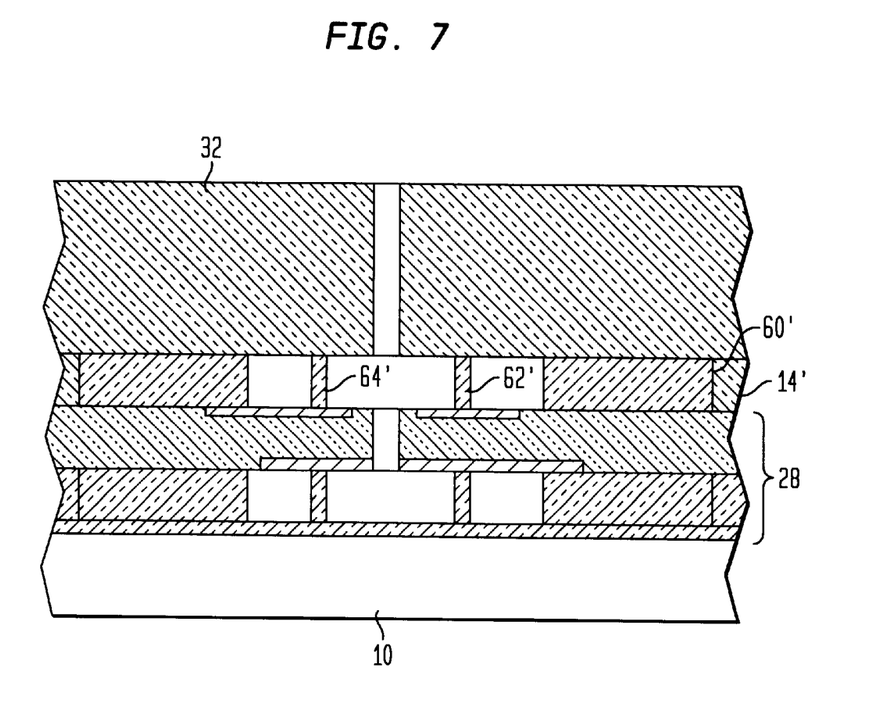
FIG. 7 illustrates a third embodiment of the thin film resonator according to the present invention.

FIG. 7 illustrates a third embodiment of the present invention. As shown therein, the process steps of FIGS. 1–4 are performed to create the first piezoelectric membrane structure 28 on the substrate 10. Then, except for forming the lower etch stop layer 12, the process steps of FIGS. 1 and 2 are repeated on the resulting structure. Subsequently, the release resistant material is planarized, and a thick cap layer 32 is deposited. The cap layer 32 serves to protect he piezoelectric membrane 19, prevents materials used in further packaging steps from corrupting the acoustical mode, and prevents atmospheric contributions to electrical failure. Preferably the thick cap layer 32 is formed of low stress silicon nitride to a thickness of several microns. As shown in FIG. 7, a via is formed in the thick cap layer 32 to expose the sacrificial layer 14', and then the sacrificial layer 14' disposed between the lateral etch barriers 60' is etched. In one embodiment, the etching of the sacrificial layer 14' is performed simultaneously with the etching of the sacrificial layer 14. As will be appreciated from FIG. 7, neither the upper electrodes 20 nor the piezoelectric layer 19 are affected by the etching.

In the above-described manner, a protective cap layer 32 is disposed over the thin film resonator, and the resulting support structure for the portions of the cap layer 32 disposed over the first piezoelectric membrane 19 (strut 62' and column 64') serve to prevent the first piezoelectric membrane 19 from coming into proximity or contact with the protective cap layer 32. As with the embodiment of FIG. 6, the support structures for the cap layer 32 may or may not be in alignment, as need or desired for device design and function, with the support structure for the piezoelectric membrane 19.

It should further be appreciated that the embodiment of FIG. 7 can be combined with the embodiment of FIG. 6 such that multiple piezoelectric membrane structures are formed on a substrate, and a protective cap layer with associated support structure is formed thereover.

Figure 8:
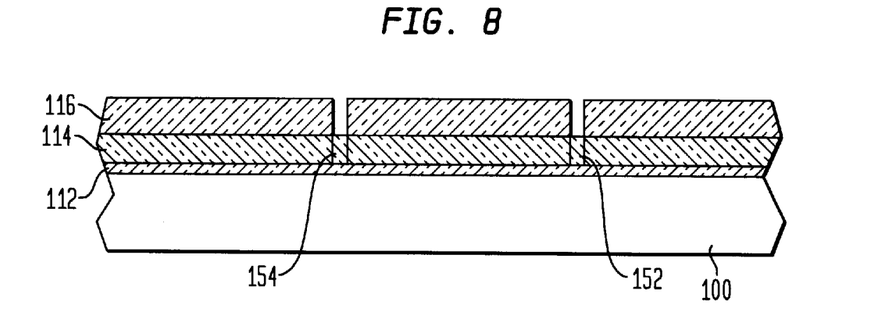
FIGS. 8–11 illustrate the method of forming a thin film resonator according to a fourth embodiment of the present invention.

A fourth method of fabricating a thin film acoustic resonator according to the present invention will now be described with respect to FIGS. 8–11. As shown in FIG. 8, a lower etch stop layer 112 and a sacrificial layer 114 are sequentially formed over a silicon substrate. The sacrificial layer 114 is patterned through photolithography to form a narrow trench 152 and a contact hole 154. As with the first embodiment of the present invention, the patterning of the sacrificial layer 114 will be commensurate with the shape of the structural supports desired by the thin film resonator designer. A release resistant material 116 is deposited over the substrate such that the release resistant material 116 fills the narrow trench 152 and the hole 154.

Figure 9:
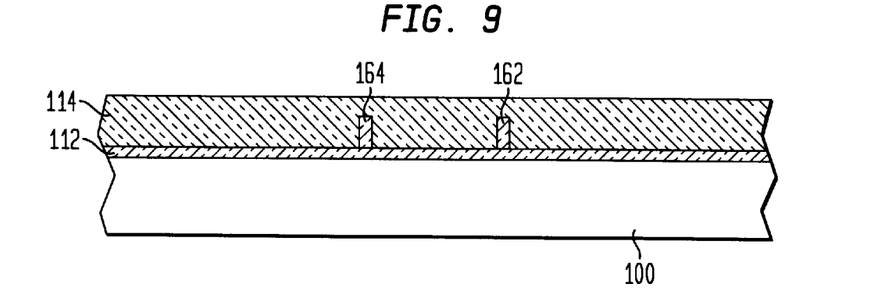

As shown in FIG. 9, after planarizing the structure shown in FIG. 8 until the sacrificial layer 114 is exposed, more sacrificial layer material is deposited thereon to increase the thickness of the sacrificial layer 114 such that the strut 162 and the peg 164 formed by the deposition of the release resistant material 116 are covered or contained within the sacrificial layer 114.

Figure 10:
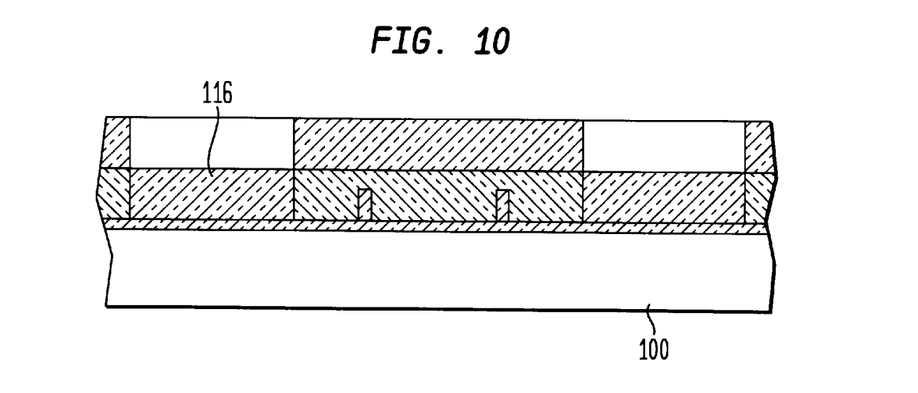
Figure 11:
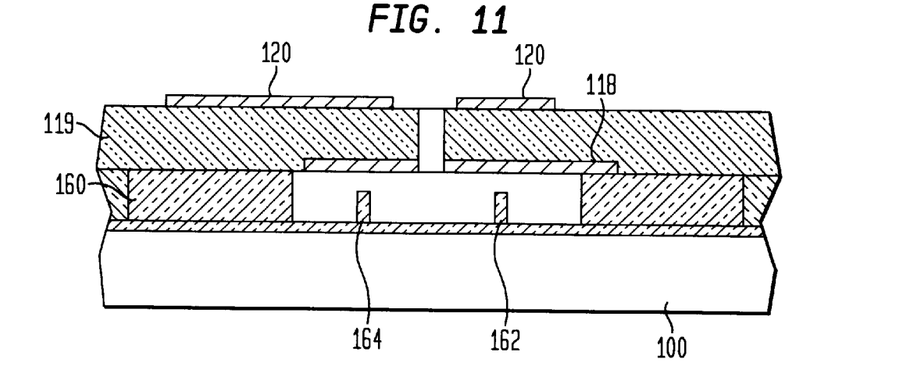

As shown in FIG. 10, the sacrificial layer 114 is patterned by photolithography to create wide lateral trenches. Release resistant material 116 is deposited once again to fill up the wide lateral trenches. The resulting structure is then planarized to form lateral etch barriers 160 as illustrated in FIG. 11. As described with respect to the first embodiment, the release resistant material 116 and the lower etch stop layer 112 have a different etch selectivity than the sacrificial layer 114.

As further shown in FIG. 11, a first conductive layer, such as aluminum is deposited over the substrate 100 and patterned to form a lower electrode 118. A piezoelectric layer 119 is then deposited over the substrate 100. Subsequently, a second conductive layer, such as aluminum, is deposited over the substrate 100, and patterned to form one or more upper electrodes 120.

Thereafter, a via is formed through the second conductive layer 120 (if present where the via is desired), the piezoelectric layer 119 and the lower electrode 118 (if present where the via is desired) to expose the sacrificial layer 114. The sacrificial layer 114 is then etched using the via leaving a cavity defined by the lower etch stop layer 112 and the lateral etch barriers 160.

As shown by FIG. 11, unlike the embodiment illustrated in FIG. 4, the support structure for the piezoelectric membrane does not span the entire height of the cavity. Instead, the strut 162 and the peg 164 allow for some bowing or flexing of the piezoelectric membrane, but do attenuate the bowing or flexing and do prevent the piezoelectric membrane from coming in contact with the bottom of the cavity. Consequently, the numerous advantages achieved by the thin film resonator according to the present invention discussed above in detail with respect to the first embodiment of the present invention are achieved by the embodiment described with respect to FIGS. 8–11.

Figure 12:
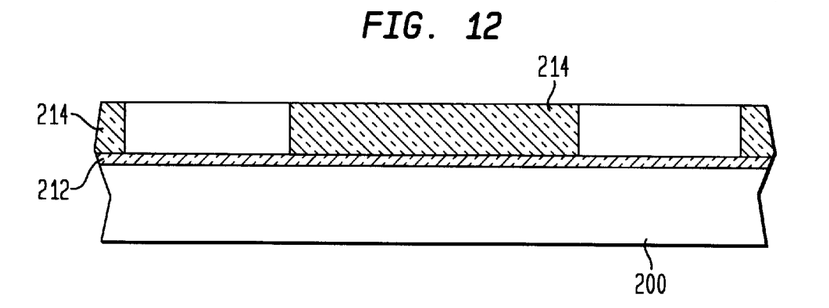
FIGS. 12–17 illustrate the method of forming a thin film resonator according to a yet another embodiment of the present invention.

FIGS. 12–17 illustrate a method of fabricating a thin film resonator according to another embodiment of the present invention. As shown in FIG. 12, a lower etch stop layer 212 and a sacrificial layer 214 are sequentially deposited over a silicon substrate 200. The sacrificial layer 214 is then patterned by photolithography to create wide lateral trenches therein.

Figure 13:
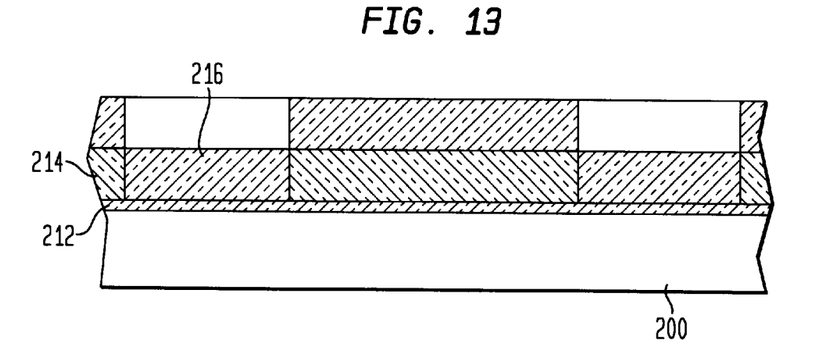
Figure 14:
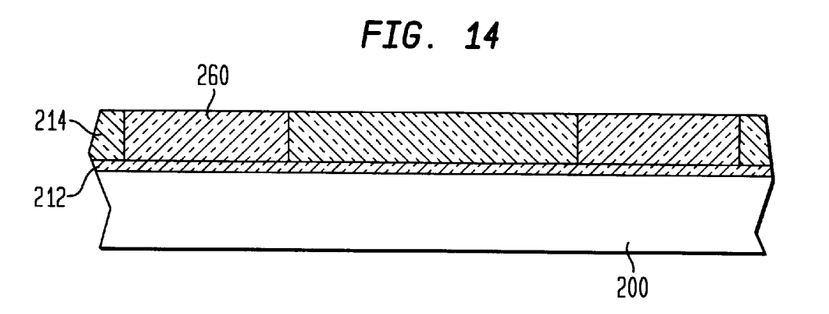

As shown in FIG. 13, a release resistant material 216 is formed over the substrate 200 such that the release resistant material 216 fills the wide lateral trenches. The resulting structure is then planarized until the sacrificial layer 214 is exposed. This leaves lateral etch barriers 260 in the wide lateral trenches as shown in FIG. 14.

Figure 15:
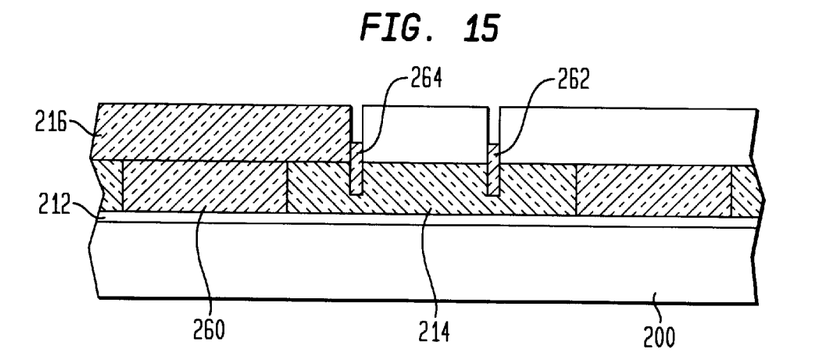

The sacrificial layer 214 disposed between the lateral etch barriers 260 is then patterned through photolithography to create a trench and hole therein. It is important to note that the trench and hole do not expose the lower etch stop layer 212 underneath the sacrificial layer 214. Again, the release resistant material 216 is formed over the substrate 200 such that the release resistant material 116 fills the trench and hole formed in the sacrificial layer 214. This deposition of the release resistant material 216 forms a strut 262 and a peg 264. As described with respect to the first embodiment, the release resistant material 216 and the lower etch stop layer 212 have a different etch selectivity than the sacrificial layer 214. In one embodiment, the same material is used for he strut 262, the peg 264 and the piezoelectric membrane 212 to provide for matched thermal expansion.

Figure 16:
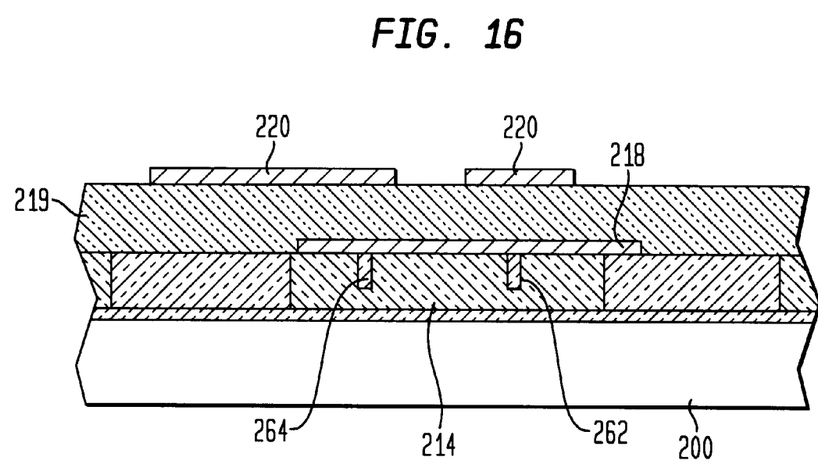

The resulting structure is once again planarized until the sacrificial layer 214 is exposed. Then, as shown in FIG. 16, a first conductive layer is formed over the substrate 200 and patterned to form a lower electrode 218. Next, a piezoelectric layer 219 is formed over the substrate 200, and then a second conductive layer is formed over the substrate 200 and patterned to form at least one upper electrode 220.

Figure 17:
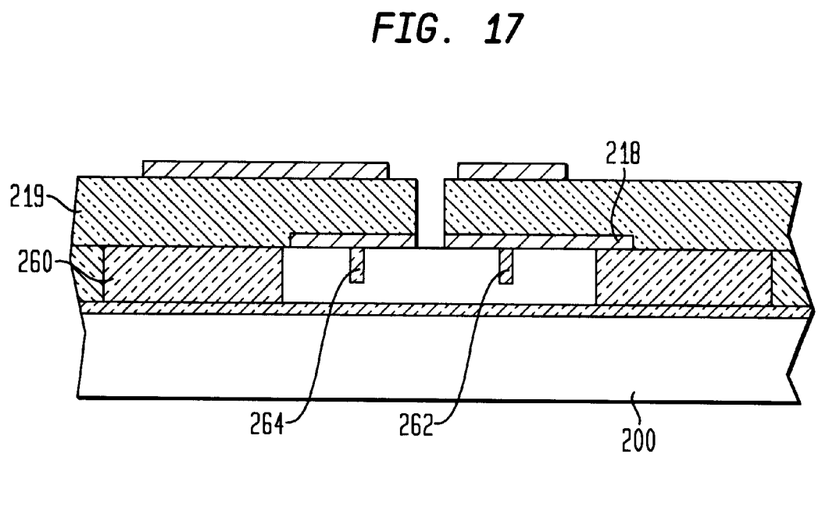

As shown in FIG. 17, a via is formed through the upper electrode 220 (if present where the via is desired), the piezoelectric layer 219 and the lower electrode 218 (if present where the via is desired) to expose the sacrificial layer 214. The sacrificial layer 214 is then etched away through the via such that a cavity is formed. The cavity is defined by the lateral etch barriers 260 and the lower etch stop layer 212.

As will be appreciated from FIG. 17, because the peg 264 and the strut 262 do not span the entire height of the cavity, some bowing or flexing of the piezoelectric membrane is permitted. However, this bowing or flexing is attenuated by the peg 264 and the strut 262, and the peg 264 and strut 262 prevent the piezoelectric membrane from coming into contact with the lower etch stop layer 212. As a result, the various advantages discussed above with respect to the first embodiment of the present invention are also achieved by this embodiment.

It should further be understood that the variations on the first embodiment discussed with respect to FIGS. 6 and 7 are equally applicable to the embodiments illustrated in FIG. 11 and FIG. 17. And, the various embodiments illustrated herein are combinable in creating a stacked membrane structure such as illustrated in FIG. 6.

The invention being thus described, it will be obvious that the same may be varied in many ways. Such variations are not to be regarded as a departure from the spirit and scope of the invention, and all such modifications are intended to be included within the scope of the following claims.

It is claimed:

1. A thin film resonator device, comprising:
   a substrate;
   a first piezoelectric membrane disposed over the substrate;

a first support structure defining a space over the substrate and supporting edges of the first piezoelectric membrane such that the first piezoelectric membrane is disposed over the space; and a first anti-flexing support structure disposed within the space to at least attenuate flexing of the first piezoelectric membrane.

2. The device of claim 1, wherein the first anti-flexing support structure substantially maintains the first piezoelectric membrane in a desired shape.

3. The device of claim 1, wherein the first piezoelectric membrane includes aluminum nitride.

4. The device of claim 1, wherein the first anti-flexing support structure includes at least one of a column and a strut spanning the space.

5. The device of claim 1, wherein the first anti-flexing support structure includes at least one of a peg and a strut indirectly connected to only one of the substrate and the first piezoelectric membrane.

6. The device of claim 1, further comprising:
at least one additional piezoelectric membrane structure disposed over the first piezoelectric membrane, each additional piezoelectric membrane structure including,
an additional anti-flexing support structure disposed over the first piezoelectric membrane, and
an additional piezoelectric member supported by the additional anti-flexing support structure.

7. The device of claim 6, wherein the additional anti-flexing support structure is in alignment with the first anti-flexing support structure.

8. The device of claim 1, further comprising:
a cap structure formed over a top most additional piezoelectric membrane structure, the cap structure including,
a cap support structure formed over the first piezoelectric membrane, and
a cap layer supported by the cap support structure.

9. The device of claim 8, wherein the cap support structure is in alignment with the first anti-flexing support structure.

10. The device of claim 1, further comprising:
a first electrode disposed between the first piezoelectric membrane and at least a portion of the first anti-flexing support structure; and
at least a second electrode disposed over the first piezoelectric membrane.

11. A thin film resonator device, comprising:
a substrate;
a piezoelectric membrane disposed over the substrate;
a first support structure defining a space over the substrate and supporting edges of the piezoelectric membrane such that the piezoelectric membrane is disposed over the space;
a first electrode disposed on a bottom surface of the piezoelectric membrane; and
at least a second electrode disposed over the piezoelectric membrane, portions of the space disposed under the first and second electrodes being an active resonator space; and
an anti-flexing support structure disposed within the active resonator space.

12. A method of fabricating a thin film resonator device, comprising:
forming a sacrificial layer over a semiconductor substrate;
forming a first anti-flexing support structure in the sacrificial layer, the first anti-flexing support structure having a different etch selectivity from the sacrificial layer;

forming an electrode over the sacrificial layer;
forming a first piezoelectric membrane layer over the semiconductor substrate;
etching a portion of the sacrificial layer under the first piezoelectric membrane layer to create a cavity under the first piezoelectric membrane layer such that the first anti-flexing support structure is disposed in the cavity to at least attenuate flexing of the first piezoelectric membrane layer.

13. The method of claim 12, wherein the forming a first anti-flexing support structure step forms the first anti-flexing support structure so that after the etching step, the first anti-flexing support structure substantially maintains the first piezoelectric membrane layer over the cavity in a desired shape.

14. The method of claim 12, wherein the first piezoelectric membrane layer includes aluminum nitride.

15. The method of claim 12, wherein the first anti-flexing support structure includes at least one of a column and a strut spanning the space.

16. The device of claim 12, wherein the first anti-flexing support structure includes at least one of a peg and a strut indirectly connected to only one of the substrate and the first piezoelectric membrane layer.

17. The method of claim 12, wherein the forming a first anti-flexing support structure step comprises:
etching the sacrificial layer according to a support structure pattern;
forming a support structure material layer, having a different etch selectivity from the sacrificial layer, over the semiconductor substrate; and
planarizing a resulting structure to expose the sacrificial layer.

18. The method of claim 12, wherein the etching step comprises:
forming at least one contact hole in the first piezoelectric membrane layer and the electrode to expose the sacrificial layer; and
etching the sacrificial layer via the contact hole.

19. The method of claim 18, prior to the forming a sacrificial layer step, further comprising:
forming a lower barrier layer over the semiconductor substrate, the lower barrier layer having a different etch selectivity than the sacrificial layer.

20. The method of claim 19, further comprising:
forming lateral barrier structures in the sacrificial layer, the lateral barrier structures having a different etch selectivity than the sacrificial layer.

21. The method of claim 12, further comprising:
forming a cap support structure over the first piezoelectric membrane layer; and
forming a cap layer supported by the cap support structure.

22. The method of claim 21, wherein the cap support structure is in alignment with the first anti-flexing support structure.

23. The method of claim 12, further comprising:
forming at least one additional piezoelectric membrane structure disposed over the first piezoelectric membrane, each additional piezoelectric membrane structure including,
an additional anti-flexing support structure disposed over the first piezoelectric membrane, and
an additional piezoelectric member supported by the additional anti-flexing support structure.

24. The method of claim 23, wherein the additional anti-flexing support structure is in alignment with the first anti-flexing support structure.

25. The method of claim 12, further comprising:
forming at least one other electrode over the first piezoelectric membrane layer.

26. A method of fabricating a thin film resonator device, comprising:
forming a sacrificial layer over a semiconductor substrate;
forming an anti-flexing support structure in the sacrificial layer, the anti-flexing support structure having a different etch selectivity from the sacrificial layer;
forming a first electrode over the sacrificial layer;
forming a piezoelectric membrane layer over the semiconductor substrate;
forming at least one second electrode over the piezoelectric membrane layer; and
etching a portion of the sacrificial layer under the piezoelectric membrane layer to create a cavity under the piezoelectric membrane layer such that the anti-flexing support structure is disposed in the cavity under both the first and second electrodes.

27. A thin film resonator device, comprising:
a substrate;
a piezoelectric membrane disposed over the substrate;
a first support structure defining a space over the substrate and supporting edges of the piezoelectric membrane such that the piezoelectric membrane is disposed over the space; and
an acoustical support structure disposed within the space to acoustically modify the piezoelectric membrane.

28. A method of fabricating a thin film resonator device, comprising:
forming a sacrificial layer over a semiconductor substrate;
forming an acoustic support structure in the sacrificial layer, the acoustic support structure having a different etch selectivity from the sacrificial layer;
forming an electrode over the sacrificial layer;
forming a piezoelectric membrane layer over the semiconductor substrate;
etching a portion of the sacrificial layer under the piezoelectric membrane layer to create a cavity under the piezoelectric membrane layer such that the acoustical support structure is disposed in the cavity to acoustically modify the piezoelectric membrane layer.

* * * * *